United States Patent
Yu Kasnavi et al.

(10) Patent No.: US 7,952,376 B1
(45) Date of Patent: May 31, 2011

(54) METHOD AND APPARATUS FOR EQUALIZER TESTING

(75) Inventors: Zunhang Yu Kasnavi, Sunnyvale, CA (US); Chung Fu, Sunnyvale, CA (US); Ramraj Gottiparthy, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 171 days.

(21) Appl. No.: 12/231,024

(22) Filed: Aug. 28, 2008

(51) Int. Cl.
*G01R 31/26* (2006.01)
(52) U.S. Cl. .................. 324/762.01; 324/750.01
(58) Field of Classification Search .............. None
See application file for complete search history.

(56) References Cited

U.S. PATENT DOCUMENTS

| | | | | |
|---|---|---|---|---|
| 5,337,316 A | * | 8/1994 | Weiss et al. | 714/716 |
| 5,953,372 A | * | 9/1999 | Virzi | 375/224 |
| 7,200,170 B1 | * | 4/2007 | Desandoli et al. | 375/224 |

OTHER PUBLICATIONS

Wong, W. et al., "Digitally Assisted Adaptive Equalizer in 90 nm With Wide Range Support From 2.5 Gbps-6.5 Gbps," DesignCon, 2007.
Azais, F. et al., "An All-Digital DFT Scheme for Testing Catastrophic Faults in PLLs," IEEE, Jan.-Feb. 2003, pp. 60-67.

* cited by examiner

*Primary Examiner* — Minh N Tang
(74) *Attorney, Agent, or Firm* — Mauriel Kapouytian & Treffert LLP; Thomas Treffert

(57) ABSTRACT

Method and apparatus are disclosed related to testing and testability of adaptive equalization circuitry. Where an equalization circuit is provided in an IC, a modified internal loopback provides a testing signal. A local comparator circuit with flexible connectivity offers analog signal testing analysis in conjunction with a low-cost external tester. Flexible use and connectivity of the comparator and external connection points, and block isolation circuitry make accurate, faster, and lower cost testing methods possible.

8 Claims, 4 Drawing Sheets

US 7,952,376 B1

METHOD AND APPARATUS FOR EQUALIZER TESTING

BACKGROUND

Data transceiver functionality is increasingly incorporated into integrated circuit (IC) designs. To effect better performance, the receiver sections of such transceivers often include equalization circuitry. Such equalization circuitry, however, often employs analog circuit components that pose testing challenges for the manufacturer. Frequently, high cost, sophisticated, precision testers are needed to adequately test on-chip equalizer functionality. Even with high end testers, producing accurate test results takes a substantial amount of test time. Accordingly, manufacturers would welcome faster and lower cost options for testing IC's with on-chip equalization and products that include them.

SUMMARY

Novel apparatus and methods are disclosed yielding improved testing and testability of equalization circuitry. In one aspect of the invention a loopback circuit provides a test signal to a receiver having an equalization function. The loopback circuit is equipped with a signal conditioner which can be used during testing to provide a test signal mimicking characteristics of imperfect, real world signals.

In another aspect of the invention a device having a loopback circuit with such a signal conditioner is tested for performance characteristics of its equalizer circuitry. Multiple measurements of a device are made using different selectable modes of signal conditioner operation. The measurements are then comparatively assessed to ascertain the performance of the equalizer.

In yet another aspect of the invention access is made at certain points within portions of the control circuitry of an adaptive equalizer circuit, including to a digital output representing an analog signal comparison. An external analog signal is applied to the control circuitry with the digital output signaling the result for testing analog circuit operation.

These and other aspects of the invention will be appreciated by one of skill in the art by the drawings and detailed description that follows.

DETAILED DESCRIPTION

Figure 1:
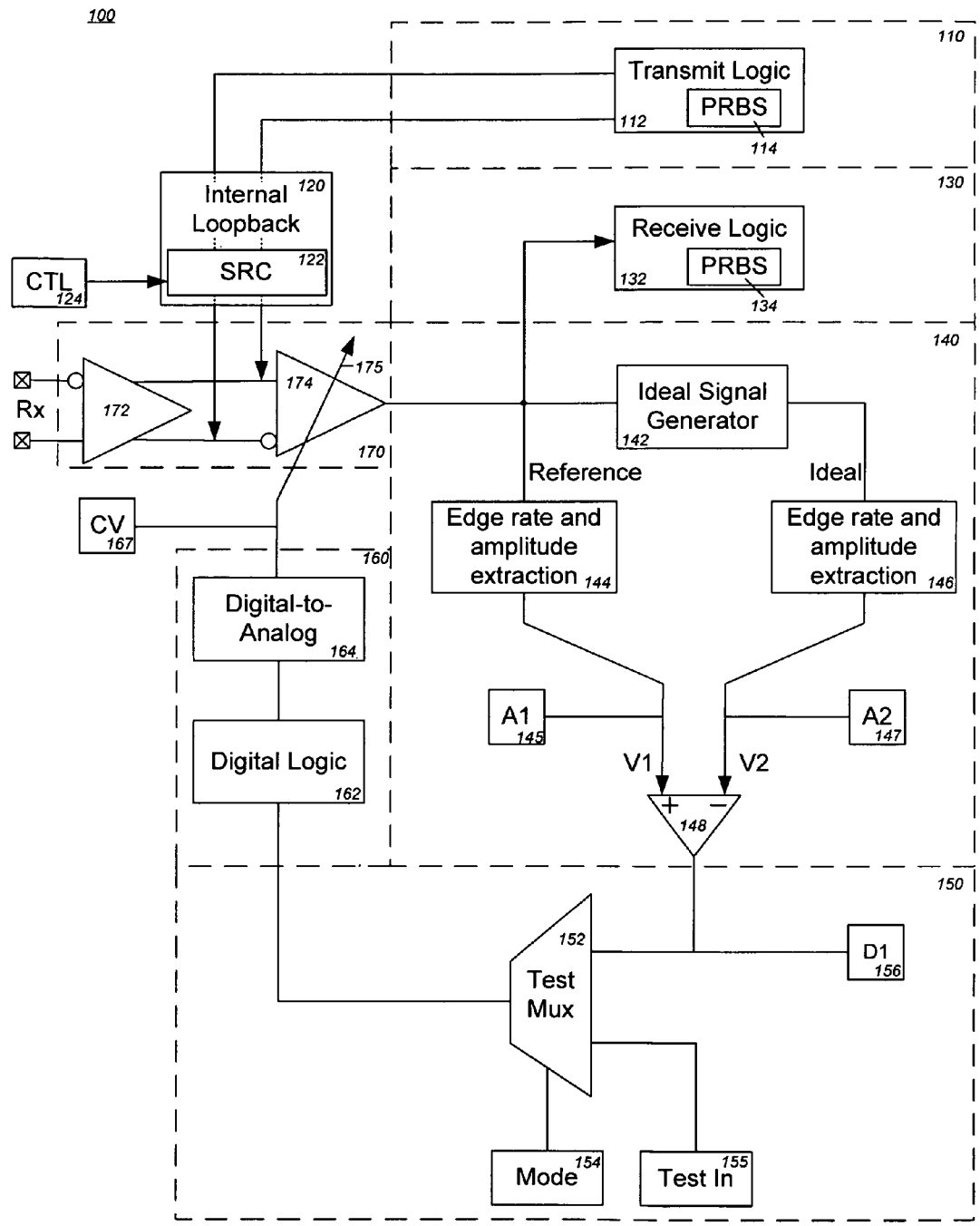
FIG. 1 shows a block diagram for a data transceiver.

FIG. 1 shows a block diagram for one data transceiver embodiment. The block diagram shows those portions of transceiver 100 helpful to building an understanding and appreciation of inventive subject matter to one of skill in the art. Typical for a block diagram, the lines connecting various blocks in FIG. 1 are not limited to representing individual conductors or discretely identifiable signals but may represent conductors, buses, or active or passive circuitry including additional function blocks, for example, for the conveyance of one or a related group of identifiable signals represented in any of a variety of ways. Use of a transceiver circuit is helpful for purposes of illustration, and a person of skill in the art will appreciate the broad use of inventive matter beyond transceiver circuitry.

Transceiver 100 includes transmitter and receiver sections, and an internal loopback section. The various sections of transceiver 100 are preferably located close together on a single silicon die. In one embodiment the silicon die is that of a programmable logic device (PLD), such as an FPGA, and transceiver 100 can be variously and programmably coupled to routing, logic, I/O, and other functional circuitry of the PLD. One of skill in the art will appreciate that inventive aspects are not limited to a PLD implementation but that many other embodiments are possible including, for example, other integrated circuit types such as ASICs.

The transmitter section 110 of transceiver 100 includes transmit logic circuit 112 which further has a pseudo random binary sequence (PRBS) generator circuit 114. PRBS generator circuit 114 is used in the production of test data during a testing operation.

The receiver section includes receiver input section 170, general receiver circuitry section 130, and equalization (EQ) circuitry (here, adaptive equalization circuitry) having analog section 140, digital section 160, and selective coupling section 150. Receiver input section 170 includes input buffer 172 and adjustable filter 174. Input buffer 172 is adapted to receive a data signal from external sources, for example, through connector pins exposed on the IC package. A buffered data signal from buffer 172 is coupled to the input side of adjustable filter 174. Adjustable filter 174 performs at least an equalization operation on its input signal to produce a data signal at its output. Control input 175 of adjustable filter 174 illustrates that the operation of filter 174 is dynamically adjustable and, in particular, that its equalization function is adjustable. The data signal from adjustable filter 174 of receiver input section 170 is conveyed to general receiver circuitry section 130 and to analog section 140 of the EQ circuitry. Receiver logic 132 of general receiver circuitry section 130 includes PRBS generator 134 which may be used during testing using known methods to generate data for comparison with the received data signal in making a determination of the accuracy of the received data.

In the analog section 140 of the EQ circuitry, the data signal from adjustable filter 174 is coupled to two signal paths, one reference and one ideal. Each of the reference and ideal signal paths includes extraction circuitry to exact information about a data signal. Edge rate and amplitude extraction circuits 144 and 146 in FIG. 1 depict extraction circuitry for the reference and ideal signal paths, respectively. Ideal signal generator 142 precedes the extraction circuitry 146 in the ideal signal path to approximate an "ideal" data signal based on its input signal. An analog output of each extraction circuit couples to a respective input of comparator 148. In a preferred embodiment, each of these analog outputs is advantageously adapted to convey its signal to additional circuitry, devices, or equipment to conduct testing operations. Such test signal access points are indicated by circuit blocks 145 and 147, each of which may include one or more passive or active electronic components or conductors. In one embodiment test signal access circuitry 145 and 147 each include a conductive path to a connection pin exposed on an IC package. Highly conductive paths principally constructed on metal layers can be advantageously employed and may be part of an analog test bus (ATB) provided on the chip. In an ASIC, test signal access circuitry 145 and 147 preferably include JTAG-configurable switchable connections to an on-chip ATB. In another embodiment where analog section 140 is to be incorporated into an FPGA device having an analog test bus, test signal access circuitry 145 and 147 each include a programmable switch to selectively couple its respective output signal to the analog test bus. A pass gate controlled by the output of a one-bit memory element is one implementation for such a programmable switch. In the preferred embodiment, test signal access circuitry 145 and 147 serve the further function of providing a path for applying analog signals from outside the analog section 140, including from circuits, devices, and equipment beyond an integrated circuit chip, to respective inputs of comparator 148.

The output of comparator 148 is coupled to circuitry adapted to convey an output signal to additional circuitry, devices, or equipment to conduct testing operations, in a preferred embodiment. Such a test signal access point is indicated by circuit block 156 including one or more passive or active electronic components or conductors. In one embodiment test signal access circuitry 156 has a highly conductive metal path to a connection pin exposed on an IC package. In another embodiment where analog section 140 is to be incorporated into an FPGA device having programmable digital signal routing resources, test signal access circuitry 156 includes a programmable switch to selectively couple the signal to digital routing resources on the chip.

The digital section 160 of the EQ circuit provides the signal that will drive the control input 175 of adjustable filter 174 to effect the adaptive aspect of adaptive equalization. Digital section 160 includes digital logic circuitry 162 with its output coupled to digital-to-analog converter 164. In one simple and space-efficient embodiment, digital logic circuitry 162 includes a binary up/down counter having a control input for a signal determining the direction of counting in a given cycle. The output of digital-to-analog converter 164 couples to drive the filter adjustment input 175. The output of digital-to- analog converter 164 further couples to test signal access point 167, implemented after the fashion of access point circuitry 145 and 147. The signal available via access point 167 is useful for testing the existence and degree of convergence achieved by the equalization system circuitry and for testing the functionality of digital section 160, itself.

The selective coupling section 150 of the EQ circuit serves to provide a selected input signal to digital section 160 of the EQ circuit. For one embodiment, the selective coupling section 150 provides the up/down direction control signal to a binary counter of digital logic 162. During normal (i.e., non-test) circuit operation, mode selection circuitry 154 signals test mode multiplexer 152 to couple the comparator 148 output of the analog section 140 to the input of digital section 160. Accordingly, in the described embodiment the 1-bit result of the comparison of the reference and ideal information signals by the comparator 148 controls the direction of counting by digital logic 162 and in turn the change to the signal applied at control input 175 of adjustable filter 174. During circuit testing operation, mode selection circuitry 154 signals test mode multiplexer 152 to couple a signal from test input circuitry 155 to the input of digital section 160. Accordingly, in the described embodiment a 1-bit signal from test input circuitry 155 controls the direction of counting by digital logic 162 and in turn the change to the signal applied at control input 175 on adjustable filter 174 to effect adaptation of the equalization function. Test input circuitry 155 may include, for example, a 1-bit memory element. In an alternative embodiment where selective coupling section 150 is to be incorporated into an FPGA device having programmable routing, logic, and I/O circuitry, test input circuitry 155 uses a programmable switch to selectively couple its respective output signal to FPGA digital signal routing resources.

Similar implementation alternatives exist for mode selection circuitry 154 as appreciated by one of ordinary skill in the art. Examples include a 1-bit memory element such as a register, latch, or SRAM cell circuit.

Inclusion in a device of circuitry illustrated within selective coupling section 150 advantageously improves testability (1) by permitting a break in the loop (from the adjustable filter 174 output to its adjustment input 175) that is effective during normal adaptive equalizer, to isolate sections of circuitry for testing, and (2) by permitting the use of comparator 148 in voltage measurement operations.

The transmitter section 110 is coupled to the receiver section by internal loopback circuit 120. During testing, the PRBS generator 114 and transmit logic 112 generates a test data signal that is applied to the input side of internal loopback circuit 120. The two lines shown connecting transmit logic circuitry 112 with internal loopback circuit 120 in FIG. 1 depict the dual conductors of the preferred embodiment provided to convey a data signal, for example, as might be used when employing a differential signaling method for high speed serial data. In a preferred embodiment, internal loopback circuit 120 can be selectively enabled, for example, in response to a control signal (not independently shown). Such use of control signals is well understood in the art and applicable implementation examples were discussed earlier in relation to selective coupling section 150. When enabled, internal loopback circuit 120 applies a data signal as an input to receiver input section 170, in particular to adjustable filter 174. The data signal applied to receiver input section 170 is based on the data signal coupled from transmitter section 110. When disabled, internal loopback circuit 120 isolates transmitter section 110 from receiver input section 170.

Internal loopback circuit 120 includes slew rate control (SRC) circuit 122. The slew rate control circuit of the preferred embodiment serves as a circuit element to condition, and in particular to distort, a data signal during testing of equalization in a receiver. Slew rate control circuit 122 acts to limit the signal slew rate in the preferred embodiment. Limiting the slew rate achieves the effect of a low pass filter attenuating the amplitude of higher frequency components in the data signal. Such attenuation preferably mimics signal distortion occurring on transmission lines that might normally be expected to carry a data signal to receiver input buffer 172 such as a twisted wire pair. Different and additional signal distortion operations can be included in the internal loopback signal pathway in other embodiments. Signal distortion circuitry can affect signal parameters other than amplitude, and as may be addressed by equalization adaptation functions and, similarly, transmission line distortion characteristics.

Control signal source circuitry 124 couples to an input of slew rate control circuitry 122 to apply a signal that varies slew rate control circuit operation. In one embodiment, slew rate control circuitry 122 accepts a binary control signal that enables or disables slew rate control conditioning on the data signal. In another embodiment, slew rate control circuitry 122 accepts a multi-bit binary control signal that disables or, alternatively, enables a stepped level of slew rate control on the data signal (e.g., low, medium, or high slew rate limiting). It is apparent to one of skill in the art that many alternatives are possible. Alternatives for control signal source circuitry 124 are similarly variable and embodiments may appropriately include physical implementations such as those previously discussed in relation to circuit blocks 156, 154, and 155.

Inclusion of the distortion element, here, the slew rate control circuit, in the internal loopback circuit of an IC transceiver improves the testability of the IC. Advantageously, dependence on a high-function external test data signal source is eliminated along with associated time requirements.

Figure 2:
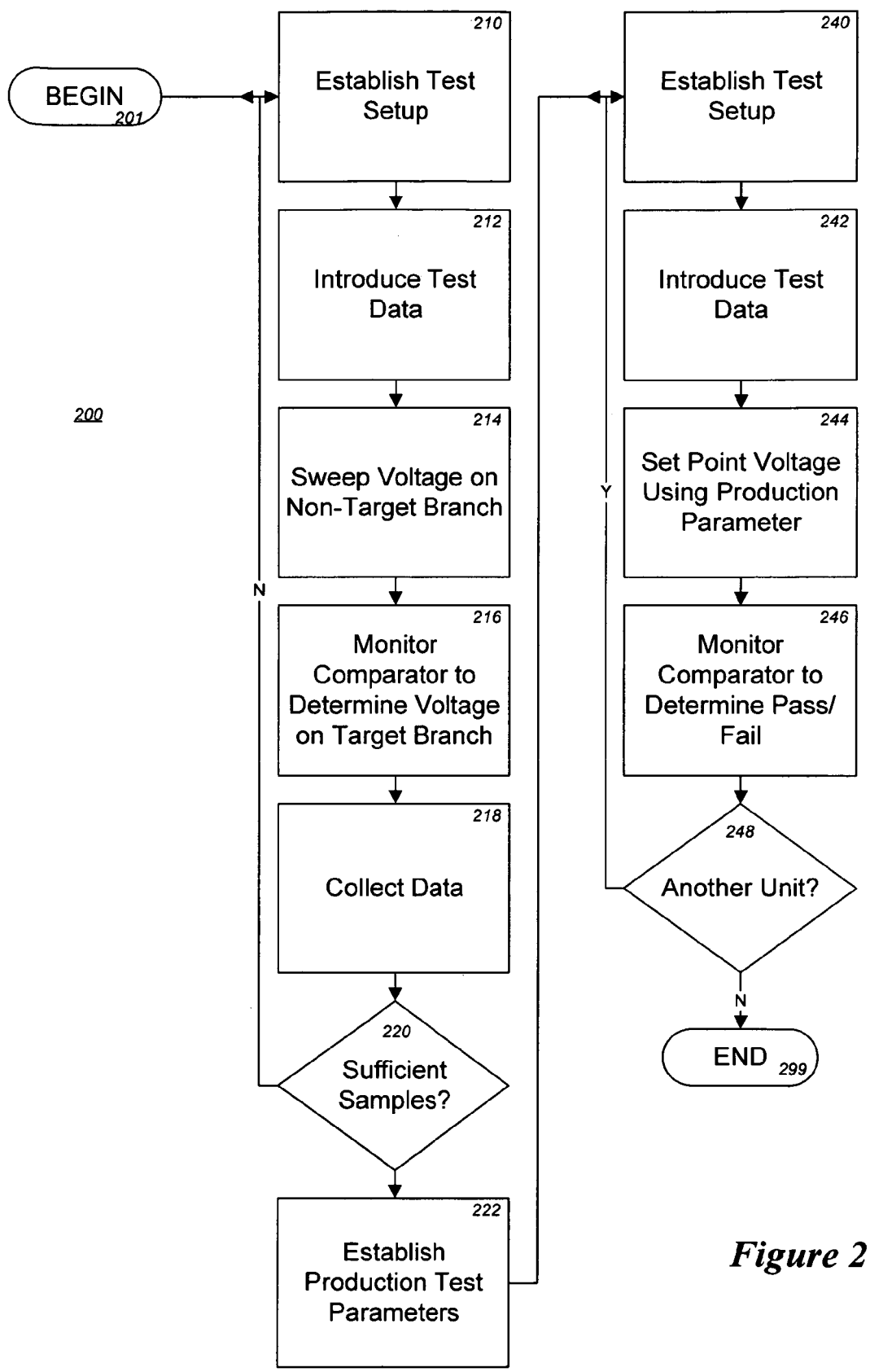
FIG. 2 depicts a flowchart for a block testing method.

FIG. 2 depicts a flowchart for a block testing method. The depicted method addresses certain testing of the analog circuit block components of an adaptive equalizer circuit such as those of analog section 140 of FIG. 1. The method depicted in FIG. 2 encompasses two phases of production testing. The first phase addresses, for example, testing of initial production volumes of any integrated circuit product in order to manage performance of the physical circuitry and establish quality thresholds, and is depicted in blocks 210 through 222 of FIG. 2. The second phase addresses, for example, regular testing of production lots over the lifetime of the product, and is depicted in blocks 240 through 248 of FIG. 2. The method is described for illustration in terms of the analog block such as 140 in FIG. 1 situated in an integrated circuit with appropriate surrounding circuitry such as that depicted in FIG. 1. The described testing targets the performance of the extraction circuits 144, 146 and the ideal signal generator 142 components of analog block 140. One of skill in the art appreciates that such a testing method may be adapted and combined with others to perform a complete range of tests on an the overall product.

The initial testing phase of FIG. 2 begins at block 210 where the test setup is established. Establishing the test set up in the preferred embodiment includes events both internal and external to the illustrative IC device under test. The IC is operated so that within the IC having the circuitry of FIG. 1, internal loopback circuit 120 is enabled and slew rate control 122 is activated by a signal applied via control source 124 to condition (with an intended distortion) the data signal as will be applied at the input of receiver input section 170. The IC is further operated so that selective coupling section 150 isolates analog section 140 from digital section 160—digital section 160 receiving an input signal coupled from test data input circuit 155 in accordance with test design parameters, rather than from comparator 148 of the analog section. The IC is further operated as necessary such that test signal access point circuitry 145, 147, and 156 each respectively couple to a pin exposed at the exterior of the IC package for connection to test equipment.

The processing of block 210 also involves test equipment connected to the IC which, in this described preferred embodiment, advantageously includes a low-cost structural tester having, for example, binary data and DC signal capabilities. Prior to inventive aspects disclosed herein, block testing such as this utilized a high-end test device typically having functional generation and observation, DC signal, pin timing, and high signal integrity capabilities, and the associated high cost. In block 210, the IC under test is connected to external test equipment by insertion into an IC socket. The external test equipment is configured to test the reference leg of analog circuit block 140 by coupling a controllable voltage source to the pin associated with access point 147, and by coupling monitor circuitry for the digital signal value exposed via access point 156.

Processing of block 212 of FIG. 2 is performed such that the IC under test (including circuitry of FIG. 1) is operated so that transmitter section 110 generates a test data signal applied to internal loopback circuit 120.

After the introduction of the conditioned data signal to the receiver circuitry, and after isolation of the EQ analog section from the digital section using the selective coupling circuitry, a sweep voltage supplied by the controllable voltage source is applied at access point 147 and the output signal of comparator 148 is monitored via access point 156. In the preferred embodiment, the controllable voltage source applies a linear sweep signal but other sweep signals that supply a range of voltage levels over time can also be used, including, for example, nonlinear continuous sweep signals and stepped sweep signals. While the sweep signal is applied to the unit under test, a change in the comparator output value signals to the test equipment the intersection of the sweep voltage with the reference voltage. The voltage of the sweep signal at the intersection point is collected as a data sample at block 218. Note that to instead target the ideal leg of analog circuit block 140 with the test procedure, the sweep voltage source coupling is moved from access point 147 to access point 145, and the sweep voltage applied there. The comparator output is identically monitored and the voltage determination made. It can be seen that the analog processing of voltage determination is advantageously performed locally by the comparator rather than by the external circuitry of test equipment. As illustrated and described, one low-speed, noise immune, digital signal is communicated off the chip to signal the voltage measurement which offers many advantages.

The test procedure described above in relation to FIG. 2 can be repeated for many IC units until the determination is made at block 220 that an adequate number of samples have been measured in accordance with production test development criteria. The collected samples are statistically analyzed to determine acceptability parameters for ongoing production units at block 222, for example, determining a maximum or minimum voltage point that an extraction circuit must achieve given a specified level of slew rate control imposed during the testing protocol. Standard production unit testing begins after a production test parameter has been established.

The standard production quality unit testing phase of FIG. 2 begins at block 240. Blocks 240 through 246 parallel processing depicted and described earlier in relation to blocks 210 through 216. Notably, however, a fixed point voltage is used during the processing of block 244 in contrast with the sweep voltage of block 214. The controllable voltage supply that supplies the voltage signal during test execution is preferably set to a fixed level representing the pass/fail threshold of a production test parameter for the leg under test. The binary output of the comparator is monitored at block 246 as it was at block 216, but, in contrast to monitoring the transition in the comparator output to determine a related voltage level as for block 216, an instantaneous determination of the level of the comparator output can be used at block 246 to simply indicate whether the unit passed or failed the test. The unit test can be repeated for the alternate leg of the EQ analog section (140 of FIG. 1) by moving the voltage supply signal to the opposite access point as in the initial testing phase. Of course, this testing can be repeated for each unit in a production lot has indicated by block 248.

Figure 3:
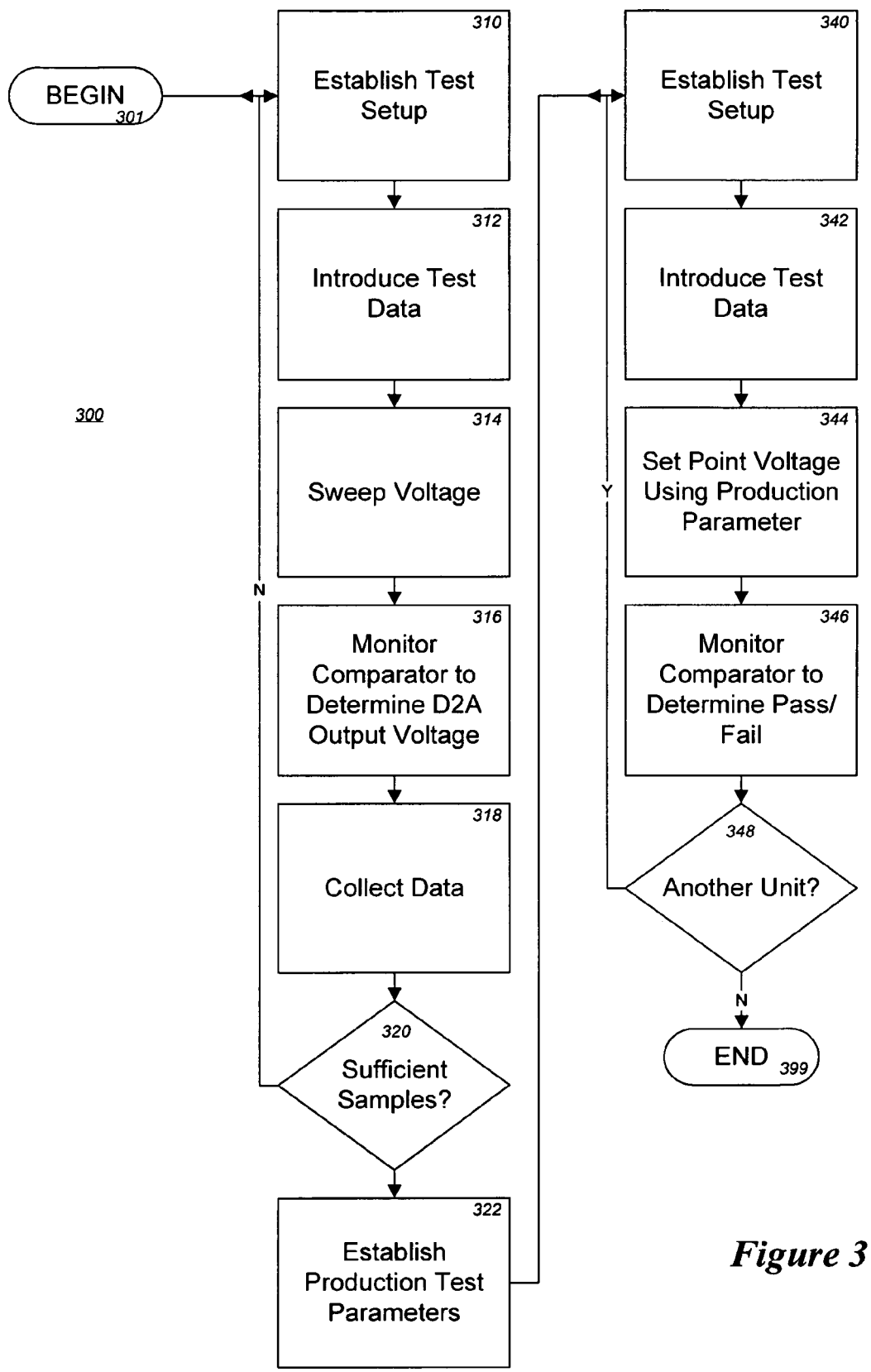
FIG. 3 depicts a flowchart for a block testing method applied to a digital circuit section.

FIG. 3 depicts a flowchart for another block testing method. One will take notice of the close parallel between the method depicted in the flowchart of FIG. 3 and that described earlier in relation to FIG. 2. The differences between the two are emphasized in the discussion below and some duplicative material is omitted. The method depicted in FIG. 3 addresses certain testing of the digital circuit block components of an adaptive equalizer circuit such as those of digital section 160 of FIG. 1. The method is described for illustration in terms of a digital block situated in an integrated circuit with appropriate surrounding circuitry such as that depicted in FIG. 1. The described testing targets the performance of the digital logic 162 and digital-to-analog 164 blocks. One of skill in the art appreciates that such a testing method may be adapted and combined with others to perform a complete range of tests on an the overall product, and in particular, the testing of adaptive equalizer analog functions as described earlier in relation to FIG. 2.

The initial testing phase of FIG. 3, as depicted in blocks 310 through 322, parallels the initial testing phase depicted and described in relation to blocks 210 through 222 of FIG. 2. Establishing the test set up at block 310 in the preferred embodiment includes events both internal and external to the illustrative IC device under test. The IC is operated so that within the IC having the circuitry of FIG. 1, test signal access point 167 is coupled to one of the inputs of comparator 148. Preferably this connection is made by coupling test signal access point 167 to an analog test bus signal path using a switch and selectively coupling either of test signal access points 145 or 147 to the same signal path of the analog test bus using a switch. The remainder of this explanation assumes access point 145 is chosen for coupling with access point 167. As in the analog section block testing, the IC is further operated so that selective coupling section 150 isolates analog section 140 from digital section 160—digital section 160 receiving an input signal coupled from test data input circuit 155 in accordance with test design parameters, rather than from comparator 148 of the analog section. The IC is further operated as necessary such that test signal access point circuitry 147 and 156 each respectively couple to a pin exposed at the exterior of the IC package for connection to test equipment. Further, in block 310, the IC under test is connected to external test equipment by insertion into an IC socket. The external test equipment is configured to test the output of digital circuit block 160 by coupling a controllable voltage source to the pin associated with access point 147, and by coupling monitor circuitry for the digital signal value exposed via access point 156. Processing of block 312 of FIG. 3 is performed such that the IC under test (including circuitry of FIG. 1) is operated so that test input circuitry 155 supplies a test signal that is applied to digital logic circuitry 162.

After isolation of the EQ analog section from the digital section using the selective coupling circuitry and the application of the test signal to the digital logic circuitry, a sweep voltage supplied by the controllable voltage source is applied at access point 147 and the output signal of comparator 148 is monitored via access point 156. In the preferred embodiment, the controllable voltage source applies a linear sweep signal but other sweep signals that supply a range of voltage levels over time can also be used as already discussed. While the sweep signal is applied to the unit under test, a change in the comparator output value signals to the test equipment the intersection of the sweep voltage with the output of digital-to-analog circuit 164. The voltage of the sweep signal at the intersection point is collected as a data sample at block 318. It can be seen that the analog processing of voltage determination is again advantageously performed locally by the comparator rather than by the external circuitry of test equipment.

The test procedure described above in relation to FIG. 3 can be repeated for many IC units until the determination is made at block 320 that an adequate number of samples have been measured in accordance with production test development criteria. The collected samples are statistically analyzed to determine acceptability parameters for ongoing production units at block 322, for example, determining a maximum or minimum voltage point that a digital-to-analog circuit must achieve given a specified input to digital logic 162 imposed during the testing protocol. Standard production unit testing begins after a production test parameter has been established.

The standard production quality unit testing phase of FIG. 3 begins at block 340. Blocks 340 through 346 parallel processing depicted and described earlier in relation to blocks 310 through 316. Notably, however, a fixed point voltage is used during the processing of block 344 in contrast with the sweep voltage of block 314. The controllable voltage supply that supplies the voltage signal during test execution is preferably set to a fixed level representing the pass/fail threshold of a production test parameter for the performance of digital section 160. The binary output of the comparator is monitored at block 346 as it was at block 316, but, in contrast to monitoring the transition of the comparator output to determine a related voltage level as for block 316, an instantaneous determination of the level of the comparator output can be used at block 346 to simply indicate whether the unit passed or failed the test.

From the above examples, one can appreciate how a comparator circuit with enhanced connectivity can advantageously provide improved device testing capability.

Figure 4:
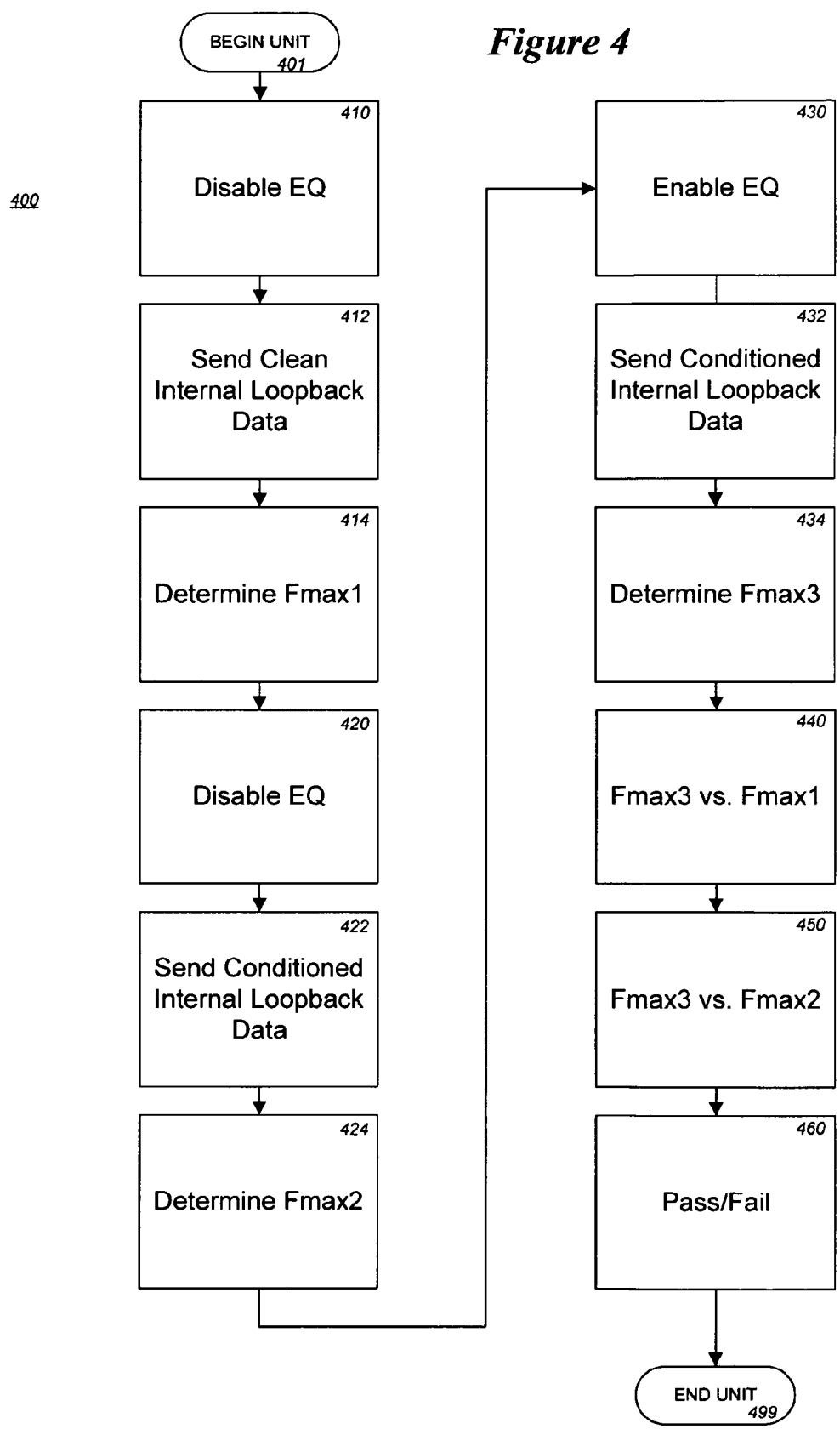
FIG. 4 depicts a flowchart for a unit system testing method.

FIG. 4 depicts a flowchart for a unit system testing method. The depicted method addresses certain testing of the circuitry that includes an adaptive equalizer system such as described earlier in relation to FIG. 1. The method depicted in FIG. 4 consists of three independent determinations of a maximum operating frequency followed by a comparative analysis of those determinations to indicate the success or failure of the equalization system in the unit under test. The method is described for illustration in terms of the receiver circuitry of FIG. 1 situated in an integrated circuit with appropriate surrounding circuitry such as depicted in FIG. 1.

The method depicted in FIG. 4 makes a determination of a first maximum operating frequency in the processing represented by blocks 410 through 414. The first maximum operating frequency determination represents the test conditions where the input signal is undistorted and adaptive equalization is disabled. Processing of block 410 operates an illustrative IC under test to disable the adaptive equalization function. In the circuitry of FIG. 1, for example, the adaptive equalization function may be effectively disabled for testing by using circuitry incorporated into the design of adjustable filter 174, by forcing a voltage level via access point 167, or by using circuitry of selective coupling section 152 break the adaptive equalization control loop by decoupling analog section 140 from digital section 160. Processing of block 412 of FIG. 4 exercises transmitter section 110 of FIG. 1 to transmit a test data signal cleanly through internal loopback 120 to the receiver input section 170 by disabling slew rate control 122. Test data is sent at a variety of frequencies. Processing of block 414 of FIG. 4 monitors the accuracy of data signal received by receiver logic circuitry 132 from receiver input section 170 by comparing it to a data signal generated by the PRBS circuit 134 of the receiver and uses the comparative results to determine a maximum frequency at which reliable reception occurs under the stated test conditions.

The method depicted in FIG. 4 makes a second determination of a maximum operating frequency in the processing represented by blocks 420 through 424. The second maximum operating frequency determination represents the test conditions where the input signal is distorted and adaptive equalization is disabled. This processing duplicates the processing already described for blocks 410 through 414 with the notable exception that the processing of block 422, here, operates the circuit under test so that the data signal applied from internal loopback circuit 122 receiver input section 170 is a "dirty" representation of the test data signal from the transmitter 110. In the circuitry of FIG. 1, for example, conditioning of the data signal to produce a dirty or distorted version is achieved by applying a control input signal to enable operation of slew rate control 122.

The method depicted in FIG. 4 makes a third determination of a maximum operating frequency in the processing represented by blocks 430 through 434. The third maximum operating frequency determination represents the test conditions where the input signal is distorted and adaptive equalization is enabled. Accordingly, the processing of blocks 430 through 434 duplicates the processing already described in reference to blocks 420 through 424 with the notable exception that the processing of block 430 operates the circuit under test to enable the adaptive equalization function using means such as those discussed in relation to the processing of block 410 for disabling that function.

Processing of block 440 compares the third maximum frequency determination with the first. Similarly, processing of block 450 compares the third maximum frequency determination with the second. At block 460 a determination is made whether the adaptive equalization system of the circuit under test passes or fails criteria established for the quality of circuit operation. In one embodiment, greater proximity of the third maximum frequency to the first maximum frequency is a greater indicator of success. In one embodiment, the greater the third maximum frequency exceeds the second maximum frequency, the greater the indicator of success. Embodiments using other measures and/or other comparisons are possible. For example, another embodiment may use both the proximity of the third maximum frequency to the first, and, the significant degree that the second maximum frequency is below the first, to establish success.

In one preferred embodiment, the circuit under test is incorporated into an FPGA IC product and processing for adaptive equalization system testing, as that depicted in FIG. 4, is carried out under the control of programmable logic within the FPGA, configured with programming data to perform such processing during a testing operation.

The above description of illustrative embodiments includes many implementation details in order to clearly explain and develop an understanding of the inventive subject matter. The reader will appreciate that use of the inventive subject matter can occur without use of the embodiments and implementation details disclosed above. The above description of illustrative embodiments also includes discussion of many alternative implementation examples. The reader will appreciate that alternative means for using inventive subject matter are not limited to the examples discussed but that many other alternatives can be employed. For example, as an alternative to routing resources or memory elements (such as configuration RAM bits) for implementation of the circuitry in an FPGA as discussed above, JTAG or test I/O resources may be used to implement the circuitry in an ASIC. These and other departures from the specific details shown and described herein will be appreciated by one of ordinary skill in the art.

What is claimed is:

1. An electronic circuit with equalization testing features, comprising:
   a loopback circuit comprising a signal conditioner circuit, said signal conditioner circuit having an input to receive a test data signal, a conditioning circuit coupled to said input and operable to perform a conditioning operation on a signal having at least one frequency component coupled from said input, and an output for providing a signal resulting from said conditioning operation; and
   an equalization circuit having an input coupled to the output of said signal conditioner circuit.

2. The electronic circuit of claim 1 wherein the conditioning operation is selectable.

3. The electronic circuit of claim 2 wherein said conditioning operation comprises a signal distortion function.

4. The electronic circuit of claim 3 wherein said signal distortion function affects the amplitude of at least one frequency component of the signal processed by the function.

5. The electronic circuit of claim 4 wherein said conditioning circuit comprises a slew rate control circuit.

6. The electronic circuit of claim 5 wherein said slew rate control circuit comprises a control signal input and is operable to vary the slew rate control function of said slew rate control circuit in accordance with a signal applied at said control signal input.

7. The electronic circuit of claim 2 wherein said conditioning circuit comprises a slew rate control circuit.

8. The electronic circuit of claim 7 wherein said slew rate control circuit comprises a control signal input and is operable to vary the slew rate control function of said slew rate control circuit in accordance with a signal applied at said control signal input.

* * * * *